United States Patent
Nitta et al.

(10) Patent No.: US 9,199,433 B2
(45) Date of Patent: *Dec. 1, 2015

(54) METAL LAMINATED STRUCTURE AND METHOD FOR PRODUCING THE METAL LAMINATED STRUCTURE

(75) Inventors: Koji Nitta, Osaka (JP); Masatoshi Majima, Osaka (JP); Shinji Inazawa, Osaka (JP); Yugaku Abe, Sakata (JP); Hiroshi Yokoyama, Sakata (JP); Osamu Suwata, Sakata (JP); Shinichi Yamagata, Sakata (JP)

(73) Assignees: SUMITOMO ELECTRIC INDUSTRIES, LTD., Osaka (JP); A.L.M.T. CORP., Tokyo (JP)

( * ) Notice: Subject to any disclaimer, the term of this patent is extended or adjusted under 35 U.S.C. 154(b) by 200 days.

This patent is subject to a terminal disclaimer.

(21) Appl. No.: 13/381,703

(22) PCT Filed: Jun. 8, 2010

(86) PCT No.: PCT/JP2010/059695
§ 371 (c)(1),
(2), (4) Date: Dec. 30, 2011

(87) PCT Pub. No.: WO2011/001795
PCT Pub. Date: Jan. 6, 2011

(65) Prior Publication Data
US 2012/0100392 A1    Apr. 26, 2012

(30) Foreign Application Priority Data

Jun. 30, 2009    (JP) ................................. 2009-155159

(51) Int. Cl.
*H01L 23/373*    (2006.01)
*B32B 15/01*    (2006.01)
(Continued)

(52) U.S. Cl.
CPC .............. *B32B 15/01* (2013.01); *C23C 28/021* (2013.01); *C25D 3/66* (2013.01); *C25D 5/10* (2013.01); *C25D 7/06* (2013.01); *C25D 7/12* (2013.01);
(Continued)

(58) Field of Classification Search
None
See application file for complete search history.

(56) References Cited

U.S. PATENT DOCUMENTS 4,025,997 A * 5/1977 Gernitis et al. ............... 428/621
4,371,589 A * 2/1983 Warner et al. ................. 428/553
(Continued)

FOREIGN PATENT DOCUMENTS

CN    1838904 A    9/2006
CN    101142080 A    3/2008
(Continued)

OTHER PUBLICATIONS

English Machine Translation of JP 2004-249589, translated Mar. 20, 2013.*
(Continued)

*Primary Examiner* — Adam Krupicka
(74) *Attorney, Agent, or Firm* — Ditthavong & Steiner, P.C.

(57) ABSTRACT

There is provided a metal laminated structure comprising a first metal layer, a second metal layer and a third metal layer, the first metal layer being disposed on one surface of the second metal layer, the third metal layer being disposed on the other surface of the second metal layer, the first metal layer including at least one of tungsten and molybdenum, the second metal layer including copper, the third metal layer including at least one of tungsten and molybdenum, and a method for producing the metal laminated structure.

7 Claims, 5 Drawing Sheets

(51) Int. Cl.
*C23C 28/02* (2006.01)
*C25D 3/66* (2006.01)
*C25D 5/10* (2006.01)
*C25D 7/06* (2006.01)
*C25D 7/12* (2006.01)
*H01L 33/64* (2010.01)

(52) U.S. Cl.
CPC ......... *H01L 23/3735* (2013.01); *H01L 23/3736* (2013.01); *H01L 33/641* (2013.01); *H01L 2924/0002* (2013.01); *Y10T 428/12826* (2015.01)

(56) References Cited

U.S. PATENT DOCUMENTS

| | | | |
|---|---|---|---|
| 4,448,854 | A | 5/1984 | Schuller et al. |
| 5,445,106 | A | 8/1995 | Einset |
| 5,525,815 | A | 6/1996 | Einset |
| 6,352,014 | B1 * | 3/2002 | Goland et al. ................. 83/684 |
| 7,593,681 | B2 | 9/2009 | Tamemasa et al. |
| 2002/0140336 | A1 * | 10/2002 | Stoner et al. .................. 313/310 |
| 2004/0140474 | A1 | 7/2004 | Ueda et al. |
| 2006/0202211 | A1 | 9/2006 | Ueda et al. |
| 2007/0102070 | A1 | 5/2007 | Tuma et al. |
| 2007/0231963 | A1 | 10/2007 | Doan et al. |
| 2008/0105553 | A1 | 5/2008 | Nitta et al. |
| 2008/0298024 | A1 | 12/2008 | Takashima et al. |
| 2009/0045431 | A1 | 2/2009 | Ueda et al. |
| 2009/0258248 | A1 | 10/2009 | Tsushima |
| 2010/0059271 | A1 | 3/2010 | Yoneda et al. |
| 2010/0243456 | A1 | 9/2010 | Nitta et al. |
| 2012/0100392 | A1 | 4/2012 | Nitta et al. |
| 2012/0164468 | A1 | 6/2012 | Kawamura |

FOREIGN PATENT DOCUMENTS

| | | |
|---|---|---|
| CN | 101291769 A | 10/2008 |
| CN | 101496165 A | 7/2009 |
| EP | 2 056 344 A1 | 5/2009 |
| JP | 1305544 A | 12/1989 |
| JP | 2080589 A | 3/1990 |
| JP | 02-256262 A | 10/1990 |
| JP | 3218054 A | 9/1991 |
| JP | 4230063 A | 8/1992 |
| JP | 6268115 A | 9/1994 |
| JP | H07-211822 A | 8/1995 |
| JP | H08-222658 A | 8/1996 |
| JP | H10-012767 A | 1/1998 |
| JP | 11284111 A | 10/1999 |
| JP | 200124370 A | 4/2000 |
| JP | 2000-323632 A | 11/2000 |
| JP | 2003-037204 A | 2/2003 |
| JP | 2004-088083 A | 3/2004 |
| JP | 2004249589 A | 9/2004 |
| JP | 2005097704 A | 4/2005 |
| JP | 2005105354 A | 4/2005 |
| JP | 2006100640 A | 4/2006 |
| JP | 2006127847 A | 5/2006 |
| JP | 2006299338 A | 11/2006 |
| JP | 3862737 B1 | 12/2006 |
| JP | 2007115731 A | 5/2007 |
| JP | 2007227458 A | 9/2007 |
| JP | 2007327081 A | 12/2007 |
| JP | 2008214728 A | 9/2008 |
| JP | 2009235462 A | 10/2009 |
| JP | 2010-529680 A | 8/2010 |
| JP | 2011149103 A | 8/2011 |
| TW | 200636934 A | 10/2006 |
| TW | 200733863 A | 9/2007 |
| WO | 2005018393 A1 | 3/2005 |
| WO | 2006038476 A1 | 4/2006 |
| WO | WO 2007/046164 A1 | 4/2007 |
| WO | 2008013279 A1 | 1/2008 |
| WO | WO 2008/013279 A1 | 1/2008 |
| WO | 2011001795 A1 | 1/2011 |

OTHER PUBLICATIONS

International Search Report for Application No. PCT/JP2010/059695; mailing date: Sep. 21, 2010.

JP Office Action dated Feb. 8, 2011 for JP Patent Application No. 155159/2009.

Nakajima et al., "Electrodeposition of Metallic Tungsten . . . ", Electrochemical and Solid-State Letters, 2005, vol. 8, C91-C94.

Notice of Grounds of Rejection in Japanese Patent Application No. 2008-333369, mailed on Jan. 8, 2013.

Office Action for related Japanese Patent Application No. 2008-333369 dated Jun. 4, 2013, 6 pages.

Notice of Grounds of Rejection for Japanese Patent Application No. 2010-185166 dated Jan. 29, 2013, pp. 1-5.

Office Action for Corresponding Application No. 2011-085441, issued Aug. 27, 2013.

Koyama, K. "Molten Salt Electrolysis of Vanadium, Molybdenum and Tungsten", Molten Salts, Molten Salt Committee of the Electrochemical Society of Japan, Feb. 2, 2000. vol. 43 No. 1, pp. 38-63. (English language contained therein).

Notification of the First Office Action for corresponding Chinese Application No. 2010800297910, dated Nov. 20, 2013, 15 pages.

Notice of Grounds of Rejection for corresponding Japanese Application No. 2010-034782, dated Apr. 1, 2014, 5 pages.

International Search Report for International Application No. PCT/JP2010/073556, dated Apr. 5, 2011, 4 pages.

Chinese Office Action for corresponding Chinese Application No. 201080064177.8, dated Apr. 1, 2014, 16 pages.

Office Action for corresponding Taiwanese Application No. 100105393, dated Jan. 29, 2015, 9 pages.

\* cited by examiner

METAL LAMINATED STRUCTURE AND METHOD FOR PRODUCING THE METAL LAMINATED STRUCTURE

TECHNICAL FIELD

The present invention relates to a metal laminated structure and a method for producing the metal laminated structure.

BACKGROUND ART

Light Emitting Diode (LED) device and similar semiconductor devices are typically provided with a radiation substrate (a heat sink) for externally radiating heat generated when a semiconductor element is driven.

For example, Patent Literature 1 (Japanese Patent Laying-Open No. 6-268115) discloses that a Cu plate formed by rolling to have a diameter of 200 mm and a thickness of 0.465 mm and an Mo plate having the same diameter as the Cu plate and a thickness of 0.090 mm are prepared and the Cu plate, then the Mo plate and then another Cu plate are successively disposed and hot pressed to provide a 1.02 mm thick Cu/Mo/Cu clad material, which is in turn used as a radiation substrate of a semiconductor device (see Patent Literature 1, paragraphs [0034]-[0049] for example).

Furthermore, Patent Literature 1 also describes that a similar method with Mo replaced with W can also be employed to obtain a significantly reliable clad material (see Patent Literature 1, paragraph [0033]).

CITATION LIST

Patent Literature

PTL 1: Japanese Patent Laying-Open No. 6-268115

SUMMARY OF INVENTION

Technical Problem

However, the radiation substrate of Patent Literature 1 is as significantly thick as 1.02 mm and it cannot satisfy a need for a thin radiation substrate.

Furthermore, a Mo plate and a W plate are restricted in to what thickness they can be rolled, and it is thus also difficult to reduce the radiation substrate's total thickness.

Furthermore, loading a Cu plate and a Mo plate into hot-press equipment whenever a clad material is produced, hot-pressing the plates, and then ejecting the clad material cannot produce a radiation substrate efficiently.

In view of the above-mentioned circumstances, the present invention contemplates a metal laminated structure that can be reduced in thickness and produced efficiently and a method for producing the same.

Solution to Problem

The present invention is a metal laminated structure including a first metal layer, a second metal layer and a third metal layer, the first metal layer being disposed on one surface of the second metal layer, the third metal layer being disposed on the other surface of the second metal layer, the first metal layer including at least one of tungsten and molybdenum, the second metal layer including copper, the third metal layer including at least one of tungsten and molybdenum.

Herein, in the present metal laminated structure, preferably, the first metal layer is formed on one surface of the second metal layer by plating, and the third metal layer is formed on the other surface of the second metal layer by plating.

Furthermore, in the present metal laminated structure, preferably, a ratio of a sum in thickness of the first metal layer and the third metal layer to a sum in thickness of the first metal layer, the second metal layer and the third metal layer is not less than 0.2 and not more than 0.8.

Furthermore, the present metal laminated structure further includes: a fourth metal layer disposed on a side of the first metal layer opposite to that side of the first metal layer provided with the second metal layer; and a fifth metal layer disposed on a side of the third metal layer opposite to that side of the third metal layer provided with the second metal layer, wherein the fourth metal layer and the fifth metal layer contain copper.

Furthermore, in the present metal laminated structure, preferably, a ratio of a sum in thickness of the first metal layer and the third metal layer to a sum in thickness of the first metal layer, the second metal layer, the third metal layer, the fourth metal layer and the fifth metal layer is not less than 0.2 and not more than 0.8.

Furthermore, the present metal laminated structure includes a cobalt containing layer at least one of a position between the first metal layer and the fourth metal layer and a position between the third metal layer and the fifth metal layer.

Furthermore, in the present metal laminated structure, preferably, the cobalt containing layer has a thickness of not less than 0.05 μm and not more than 3 μm.

Furthermore, the present metal laminated structure preferably has a total thickness of not less than 20 μm and not more than 400 μm.

Furthermore, the present metal laminated structure is preferably used for a heat sink.

Furthermore, the present invention is a method for producing the metal laminated structure as described above, including the steps of: disposing the first metal layer on one surface of the second metal layer by plating; and disposing the third metal layer on the other surface of the second metal layer by plating.

Herein, in the present method for producing the metal laminated structure, preferably, the plating is molten salt bath plating.

Advantageous Effects of Invention

The present invention can thus provide a metal laminated structure that can be reduced in thickness and produced efficiently and a method for producing the same.

DESCRIPTION OF EMBODIMENTS

Hereinafter, the present invention will be described in embodiments. In the figures, identical or corresponding components are identically denoted.

<Metal Laminated Structure>

Figure 1:
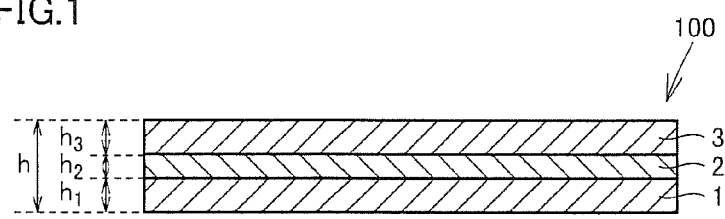
FIG. 1 is a schematic cross section of an example of a metal laminated structure of the present invention.

FIG. 1 is a schematic cross section of an example of a metal laminated structure of the present invention. Herein, a metal laminated structure 100 is configured of a structure formed of a stack of layers that are a first metal layer 1, a second metal layer 2 disposed on first metal layer 1, and a third metal layer 3 disposed on second metal layer 2. That is, metal laminated structure 100 has first metal layer 1 disposed on one surface of second metal layer 2, and third metal layer 3 disposed on the other surface of second metal layer 2.

First metal layer 1 is a metal layer formed of a metal including at least one of tungsten and molybdenum, and in particular, in view of reducing metal laminated structure 100 in thickness to produce it efficiently, it is preferable that first metal layer 1 is a tungsten or molybdenum layer formed by plating.

Furthermore, second metal layer 2 is a metal layer formed of a metal including copper, and in particular, in view of reducing metal laminated structure 100 in thickness to produce it efficiently, it is preferable that second metal layer 2 is for example copper foil or a similar thin plate of copper.

Furthermore, third metal layer 3 is a metal layer formed of metal including at least one of tungsten and molybdenum, and in particular, in view of reducing the structure formed of a stack of layers of metal 100 in thickness to produce it efficiently, it is preferable that third metal layer 3 is a tungsten or molybdenum layer formed by plating.

Furthermore, metal laminated structure 100 preferably has a total thickness h of not less than 20 μm and not more than 400 μm. When metal laminated structure 100 has thickness h of not less than 20 μm and not more than 400 μm it has an increased tendency that it can have a reduced thickness and thus be produced efficiently.

Furthermore, when metal laminated structure 100 has first metal layer 1 having a thickness $h_1$, second metal layer 2 having a thickness $h_2$, and third metal layer 3 having a thickness $h_3$, then, a ratio of $(h_1+h_3)$ relative to $(h_1+h_2+h_3)$, i.e., $(h_1+h_3)/(h_1+h_2+h_3)$, is preferably a ratio of not less than 0.2 and not more than 0.8. For the ratio of not less than 0.2 and not more than 0.8, metal laminated structure 100 neither provides excessively large linear expansion nor excessively small heat conductivity, so that when metal laminated structure 100 is attached to a semiconductor substrate of a semiconductor device for example as a heat sink, metal laminated structure 100 and the semiconductor substrate do not thermally expand significantly differently, and there is a tendency that metal laminated structure 100 can sufficiently exhibit its function to radiate heat.

Furthermore, in order to minimize warpage of metal laminated structure 100, it is preferable that metal laminated structure 100, as seen at a center thereof as seen depthwise (in this example, a portion at ½ of total thickness h of metal laminated structure 100), has an upper portion and a lower portion symmetrically with respect to the depthwise center. Note that in the present invention, being symmetrical means not only an idea that metal laminated structure 100 as seen at the depthwise center vertically upward toward its upper end has layers completely identical in material and equal in thickness to those of metal laminated structure 100 as seen at the depthwise center vertically downward toward its lower end, but also an idea that the former has layers equivalent in material and thickness to those of the latter.

<Method for Producing a Metal Laminated Structure>

One example of a method for producing metal laminated structure 100 shown in FIG. 1 will be described hereinafter. It should be noted, however, that the present method for producing a metal laminated structure is not limited thereto.

Figure 2:
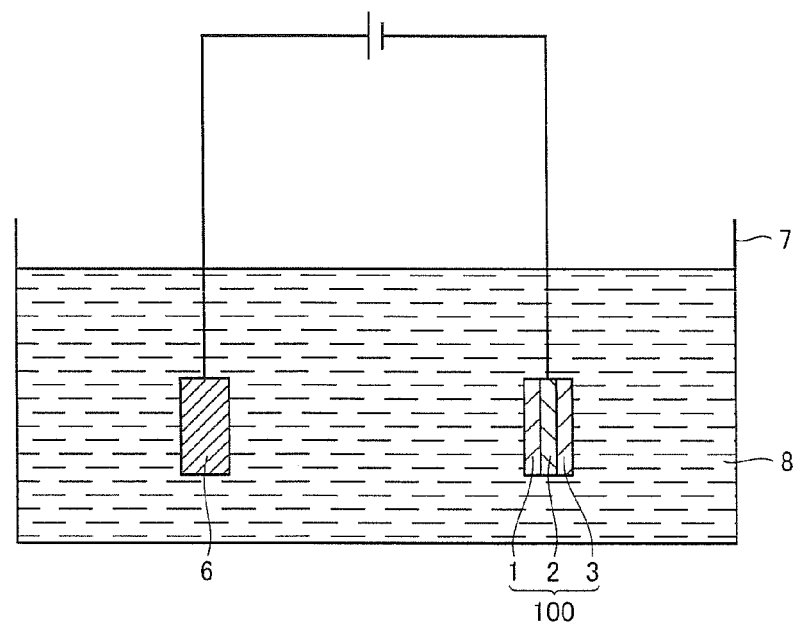
FIG. 2 schematically shows a configuration for illustrating an example of a method for producing a metal laminated structure of the present invention.

Initially, as shown in the schematic configuration of FIG. 2, a molten salt bath 8 containing at least one of tungsten and molybdenum is accommodated in a container 7. Molten salt bath 8 may be any that can be electrolyzed to deposit at least one of tungsten and molybdenum. Note that molten salt bath 8 preferably has a configuration, as will be described later.

Subsequently, for example, second metal layer 2 of copper foil and a counter electrode 6 are immersed in molten salt bath 8 accommodated in container 7. Herein, counter electrode 6 can be any electrode that is electrically conductive, and it can for example be an electrode formed of metal.

Subsequently, with second metal layer 2 of copper foil serving as a negative electrode and counter electrode 6 serving as a positive electrode, a voltage is applied between second metal layer 2 of copper foil and counter electrode 6 to electrolyze molten salt bath 8 to deposit tungsten and/or molybdenum in molten salt bath 8 on the opposite surfaces of second metal layer 2 of copper foil to provide first metal layer 1 and third metal layer 3 through molten salt bath plating.

Then, a copper foil as second metal layer 2 provided with first metal layer 1 and third metal layer 3 is extracted from molten salt bath 8, and ion exchanged water or the like is used to wash away molten salt bath 8 on first metal layer 1 and third metal layer 3. Then for example a predetermined acid is used for cleaning to remove oxide film formed on a surface of each of first metal layer 1 and third metal layer 3. Metal laminated structure 100 shown in FIG. 1 can thus be produced.

Figure 3:
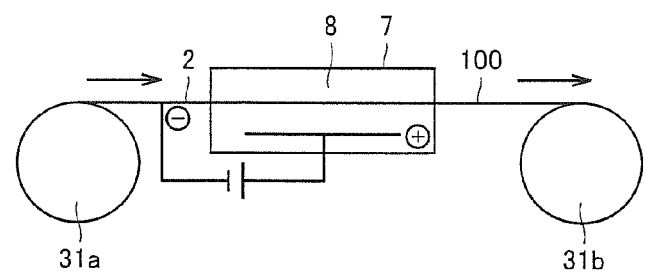
FIG. 3 schematically shows a configuration for illustrating an example of the method for producing a metal laminated structure of the present invention.

Furthermore, metal laminated structure 100 shown in FIG. 1 can also be produced for example as follows:

Initially, as shown in the schematic configuration of FIG. 3, a copper foil as second metal layer 2 is bridged between a first roll 31a and a second roll 31b through molten salt bath 8 accommodated in container 7.

Subsequently, the copper foil as second metal layer 2 is sent out from first roll 31a, and continuously immersed into molten salt bath 8 in container 7, while molten salt bath 8 is electrolyzed to deposit tungsten and/or molybdenum on the opposite surfaces of the copper foil to form metal laminated structure 100 by molten salt bath plating.

Then, metal laminated structure 100 formed by depositing tungsten and/or molybdenum on the opposite surfaces of the copper foil is wound up by second roll 31b and thus collected.

As mentioned above, continuously depositing tungsten and/or molybdenum on a surface of second metal layer 2 to continuously form metal laminated structure 100 allows metal laminated structure 100 to be produced furthermore efficiently.

<Semiconductor Device>

Figure 4:
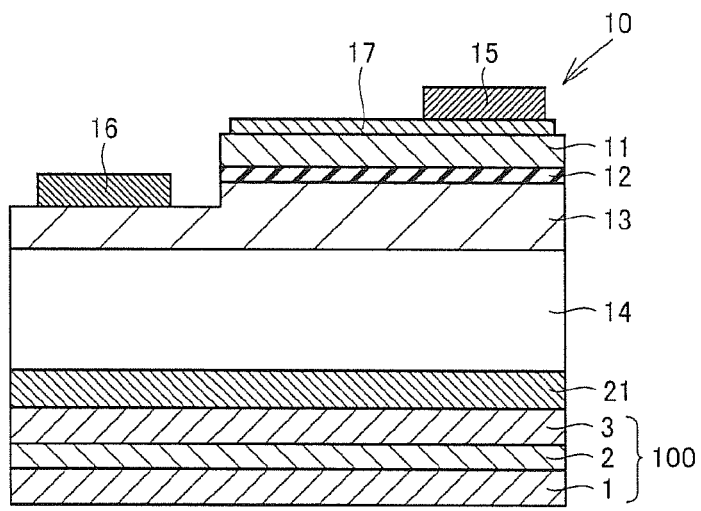
FIG. 4 is a schematic cross section of an example of an LED device that is an example of a semiconductor device using the metal laminated structure of the present invention.

FIG. 4 is a schematic cross section of an example of an LED device that is an example of a semiconductor device using the metal laminated structure of the present invention.

Herein, the LED device shown in FIG. 4 includes metal laminated structure 100 shown in FIG. 1, and an LED structure 10 provided on metal laminated structure 100, and metal laminated structure 100 and LED structure 10 are joined together by a joining layer 21.

Herein, LED structure 10 includes a semiconductor substrate 14, an n type semiconductor layer 13 disposed on semiconductor substrate 14, an active layer 12 disposed on n type semiconductor layer 13, a p type semiconductor layer 11 disposed on active layer 12, a semi-transparent electrode 17 disposed on p type semiconductor layer 11, a p electrode 15 disposed on semi-transparent electrode 17, and an n electrode 16 disposed on n type semiconductor layer 13.

Note that LED structure 10 may be any structure that includes p type semiconductor layer 11, n type semiconductor layer 13 and active layer 12 with active layer 12 posed between p type semiconductor layer 11 and n type semiconductor layer 13, and allows a current injected thereto to cause active layer 12 to emit light, and it can for example be a conventionally known LED structure.

LED structure 10 preferably has p type semiconductor layer 11, active layer 12, and n type semiconductor layer 13 each formed with a compound of a group III element (at least one element selected from the group consisting of Al, In and Ga) and a group V element (nitrogen), or a group III-V nitride semiconductor, in particular. This allows active layer 12 to emit blue light.

One example of LED structure 10 that allows active layer 12 to emit blue light can for example be a LED structure with semiconductor substrate 14 shown in FIG. 4, p type semiconductor layer 11, active layer 12 and n type semiconductor layer 13 implemented as a GaN or sapphire substrate, a p type GaN layer, an undoped InGaN layer and an n type GaN layer, respectively.

Furthermore, the metal laminated structure of the present invention is not limited to an LED device, and is also applicable to semiconductor devices other than the LED device, such as a semiconductor laser device or a field effect transistor. Herein, semiconductor substrate 14 used for a semiconductor device other than LED structure 10 allowing active layer 12 to emit blue light can for example be a silicon substrate, a silicon carbide substrate, a gallium arsenide substrate or the like.

It is needless to say that p type semiconductor layer 11 is a semiconductor layer having the p type conduction type doped with p type impurity and n type semiconductor layer 13 is a semiconductor layer having the n type conduction type doped with n type impurity. Furthermore, active layer 12 may be a semiconductor layer which may have one of the p and n type conduction types and may be undoped with any of p type impurity and n type impurity.

Furthermore, another layer may be included at least one of locations: between semiconductor substrate 14 and n type semiconductor layer 13; between n type semiconductor layer 13 and active layer 12; between active layer 12 and p type semiconductor layer 11; between p type semiconductor layer 11 and semi-transparent electrode 17; between semi-transparent electrode 17 and p electrode 15; and between n type semiconductor layer 13 and n electrode 16.

Furthermore, joining layer 21 can be implemented for example as a layer formed of an electrically conductive substance higher in thermal conductivity than eutectic solder. In particular, joining layer 21 is preferably formed with a metal having low electric resistance and high thermal conductivity and less oxidizable, and inter alia, it is more preferably a layer containing at least one selected from the group consisting of gold, silver, copper, and nickel.

The LED device thus configured has n electrode 16 as a negative electrode and p electrode 15 as a positive electrode and therebetween voltage is applied to pass a current through LED structure 10 from p electrode 15 to n electrode 16. LED structure 10 thus allows active layer 12 between p type semiconductor layer 11 and n type semiconductor layer 13 to generate light.

Note that the LED device of the configuration shown in FIG. 4 can be produced for example as follows:

Initially, semiconductor substrate 14 is set for example in metal organic chemical vapor deposition (MOCVD) equipment, and thereafter, as shown for example in FIG. 4 schematic cross section, on a surface of semiconductor substrate 14, n type semiconductor layer 13, then active layer 12, and then p type semiconductor layer 11 are successively, epitaxially grown for example through MOCVD or the like.

Then, n-type semiconductor layer 13, active layer 12, and p-type semiconductor layer 11 are partially removed, by for example photo-etching and then, for example, lift off is employed to form semi-transparent electrode 17 and p electrode 15 on p type semiconductor layer 11, and form n electrode 16 on n type semiconductor layer 13.

After p electrode 15 and n electrode 16 are formed, metal laminated structure 100 is joined via joining layer 21 to a back surface of semiconductor substrate 14.

Then for example a round rotary blade or the like is used after joining layer 21 is provided to cut semiconductor substrate 14 to divide the intermediate product into individual LED devices having a schematic cross section shown in FIG. 4. Thus, the LED device configured as shown in FIG. 4 can be obtained.

Furthermore, the present invention allows metal laminated structure 100 that is significantly smaller in thickness than conventional to be used as a heat sink of a semiconductor device. This allows metal laminated structure 100 to be produced at a reduced cost for its materials and can also facilitate cutting metal laminated structure 100 to divide it into devices and thus achieve better workability. Furthermore, metal laminated structure 100 reduced in thickness allows a semiconductor device per se to be reduced in thickness.

<Other Embodiments>

Figure 5:
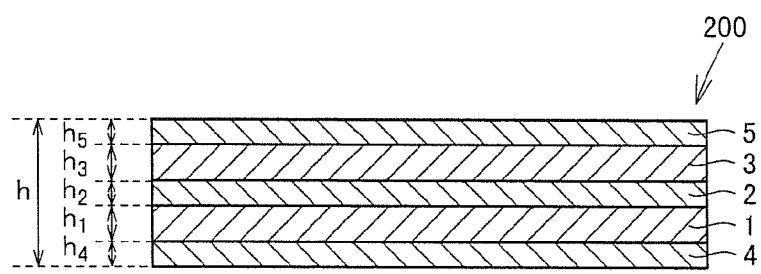
FIG. 5 is a schematic cross section of another example of the metal laminated structure of the present invention.

FIG. 5 is a schematic cross section of another example of the metal laminated structure of the present invention. Herein, a metal laminated structure 200 is characterized in that it includes a fourth metal layer 4 provided on a side of first metal layer 1 opposite to that provided with second metal layer 2 and a fifth metal layer 5 provided on a side of third metal layer 3 opposite to that provided with second metal layer 2.

Herein, fourth metal layer 4 and fifth metal layer 5 can each be implemented as a metal layer formed for example of a metal including copper.

Herein, metal laminated structure 200 also preferably has total thickness h of not less than 20 μm and not more than 400 μm. Metal laminated structure 200 having thickness h of not less than 20 μm and not more than 400 μm has an increased tendency that it can have a reduced thickness and thus be produced efficiently.

Furthermore, when metal laminated structure 200 has first metal layer 1 having thickness $h_1$, second metal layer 2 having thickness $h_2$, third metal layer 3 having thickness $h_3$, fourth metal layer 4 having a thickness $h_4$, and fifth metal layer 5 having a thickness $h_5$, then, a ratio of $(h_1+h_3)$ relative to $(h_1+h_2+h_3+h_4+h_5)$, i.e., $(h_1+h_3)/(h_1+h_2+h_3+h_4+h_5)$, is preferably a ratio of not less than 0.2 and not more than 0.8. For the ratio of not less than 0.2 and not more than 0.8, metal laminated structure 200 neither provides excessively large linear expansion nor excessively small heat conductivity, so that when metal laminated structure 200 is attached to a semiconductor substrate of a semiconductor device for example as a heat sink, metal laminated structure 200 and the semiconductor substrate do not thermally expand significantly differently, and there is a tendency that metal laminated structure 200 can sufficiently exhibit its function to radiate heat.

Furthermore, in order to minimize warpage of metal laminated structure 200, it is preferable that metal laminated structure 200 as seen at a center thereof as seen depthwise (in this example, a portion at ½ of total thickness h of metal laminated structure 200) has an upper portion and a lower portion symmetrically with respect to the depthwise center.

Metal laminated structure 200 shown in FIG. 5 can be produced for example as follows:

Initially, by the above-mentioned method shown in FIG. 2, tungsten and/or molybdenum in molten salt bath 8 is/are deposited on the opposite surfaces of second metal layer 2 such as copper foil to provide first metal layer 1 and third metal layer 3 by molten salt bath plating.

Then, second metal layer 2 provided with first metal layer 1 and third metal layer 3 is extracted from molten salt bath 8, and ion exchanged water or the like is used to wash away molten salt bath 8 on first metal layer 1 and third metal layer 3. Then for example a predetermined acid is used for cleaning to remove oxide film formed on a surface of each of first metal layer 1 and third metal layer 3.

Figure 6:
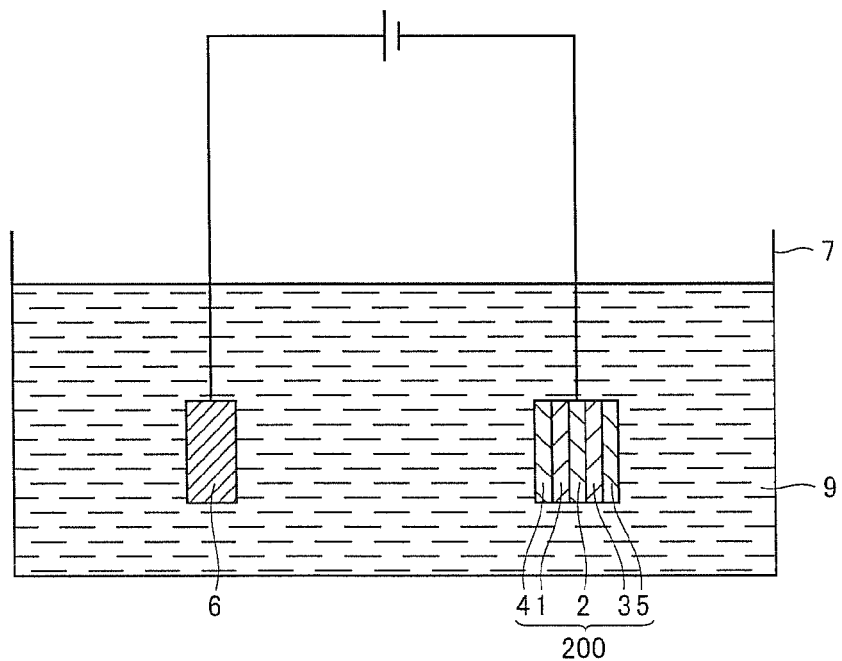
FIG. 6 schematically shows a configuration for illustrating an example of the method for producing a metal laminated structure of the present invention.

Then, second metal layer 2 with first metal layer 1 and third metal layer 3, and counter electrode 6 are immersed into electroplating solution 9 accommodated in container 7, as shown in the schematic configuration of FIG. 6.

Electroplating solution 9 may be any that contains metal atoms configuring fourth metal layer 4 and fifth metal layer 5 and can be electrolyzed to deposit metal that configures fourth metal layer 4 and fifth metal layer 5, and for example when fourth metal layer 4 and fifth metal layer 5 are formed of copper, electroplating solution 9 can for example be a commercially available copper sulfate plating solution.

Subsequently, with second metal layer 2 serving as a negative electrode and counter electrode 6 serving as a positive electrode, a voltage is applied between second metal layer 2 and counter electrode 6 to electrolyze electroplating solution 9. Thus, copper in electroplating solution 9 is deposited on a surface of first metal layer 1 and a surface of third metal layer 3 to provide fourth metal layer 4 and fifth metal layer 5 to produce metal laminated structure 200.

Then, metal laminated structure 200 with fourth metal layer 4 and fifth metal layer 5 is extracted from electroplating solution 9, and ion exchanged water or the like is used to wash away electroplating solution 9 on fourth metal layer 4 and fifth metal layer 5. Then for example a predetermined acid is used for cleaning to remove oxide film formed on a surface of each of fourth metal layer 4 and fifth metal layer 5. Metal laminated structure 200 shown in FIG. 5 can thus be produced.

Figure 7:
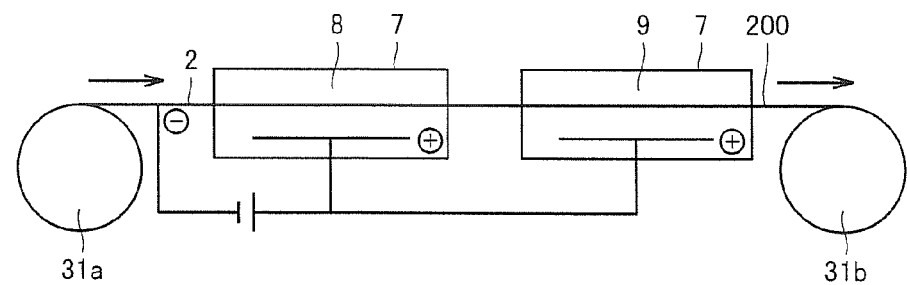
FIG. 7 schematically shows a configuration for illustrating an example of the method for producing a metal laminated structure of the present invention.

Furthermore, metal laminated structure 200 shown in FIG. 5 can also be produced for example as follows:

Initially, as shown in FIG. 7 schematic configuration, a copper foil as second metal layer 2 is bridged between first roll 31a and second roll 31b through molten salt bath 8 and electroplating solution 9 accommodated in containers 7, respectively.

Subsequently, the copper foil is sent out from first roll 31a, and continuously immersed into molten salt bath 8 in container 7, while molten salt bath 8 is electrolyzed to deposit tungsten and/or molybdenum on the opposite surfaces of the copper foil to form first metal layer 1 and third metal layer 3 on the opposite surfaces, respectively, of the copper foil by molten salt bath plating.

Then, the copper foil with first metal layer 1 and third metal layer 3 is continuously immersed in electroplating solution 9 accommodated in container 7, while electroplating solution 9 is electrolyzed. This deposits copper on a surface of first metal layer 1 and that of third metal layer 3 to electroplate the surface of first metal layer 1 and that of third metal layer 3 with fourth metal layer 4 and fifth metal layer 5, respectively, to provide metal laminated structure 200.

Then, metal laminated structure 200 is wound up by second roll 31b and thus collected.

Furthermore, while in the above description fourth metal layer 4 and fifth metal layer 5 are provided using electroplating solution 9, it is needless to say that fourth metal layer 4 and fifth metal layer 5 may be provided in any other method.

For example, metal laminated structure 200 can also be formed by forming fourth metal layer 4 and fifth metal layer 5 by a conventionally known vapor phase method, such as sputtering.

Furthermore, fourth metal layer 4 and fifth metal layer 5 may be formed through a combination of electrolyzing an electroplating solution, as described above, and the vapor phase method such as sputtering.

Furthermore, the metal laminated structure is not limited to the structure of the above-mentioned three or five layers, and may be any structure that includes first metal layer 1, second metal layer 2, and third metal layer 3 in the order described above.

Figure 8:
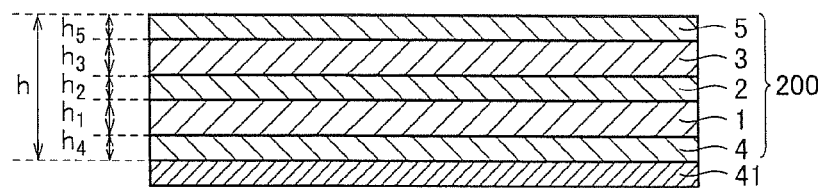
FIG. 8 is a schematic cross section of still another example of the metal laminated structure of the present invention.

Furthermore, as shown for example in the schematic cross section of FIG. 8, metal laminated structure 200 may have a metal layer 41 formed for example of nickel on a surface of fourth metal layer 4 opposite to that provided with first metal layer 1.

Furthermore, metal laminated structure 200 may have a cobalt containing layer between first metal layer 1 and fourth metal layer 4 and/or between third metal layer 3 and fifth metal layer 5.

Metal laminated structure 200 including the above-mentioned cobalt containing layer can be produced for example as follows:

Initially, first metal layer 1 and third metal layer 3 formed on the opposite surfaces, respectively, of second metal layer 2 are immersed in an alkaline solution to degrease a surface of first metal layer 1 and that of third metal layer 3.

Subsequently, first metal layer 1 and third metal layer 3 are immersed in an alkaline aqueous solution as a positive electrode and, in that condition, electrolysis is performed to remove oxide film on a surface of first metal layer 1 and a surface of third metal layer 3.

Subsequently, after the oxide film is removed, first metal layer 1 and third metal layer 3 are immersed as a negative electrode in a cobalt plating solution for example of an aqueous solution of cobalt sulfate and, in that condition, electrolysis is performed to deposit cobalt on a surface of first metal layer 1 and a surface of third metal layer 3 to provide a cobalt containing layer.

Then, the cobalt layer is immersed into a copper sulfate plating solution as a negative electrode and, in that condition, electrolysis is performed to deposit copper on a surface of the cobalt layer to provide fourth and fifth metal layers 4 and 5 formed of copper.

Thus, metal laminated structure 200 can have a cobalt containing layer between first metal layer 1 and fourth metal layer 4 and between third metal layer 3 and fifth metal layer 5.

<Preferable Configuration of Molten Salt Bath>

The present invention can employ molten salt bath 8 such as prepared by melting a mixture of potassium fluoride (KF), boron oxide ($B_2O_3$), and tungsten oxide ($WO_3$) provided at a molar ratio for example of 67:26:7.

Furthermore, if first metal layer 1 and third metal layer 3 are formed of molybdenum, then, molten salt bath 8 can be prepared for example by melting at approximately 850° C. a mixture of KF, $K_2MoO_4$ and $B_2O_3$ provided at a molar ratio for example of 81:9:10.

Furthermore, if first metal layer 1 and third metal layer 3 are formed of tungsten and molybdenum, respectively, then, molten salt bath 8 can be prepared for example by melting at approximately 850° C. a mixture of KF, $WO_3$, $K_2MoO_4$, and $B_2O_3$ provided at a molar ratio for example of 80:4:5:10.

EXAMPLES

<Production of Heat Sink of Example 1>

319 g of KF powder and 133 g of $WO_3$ powder were sealed in a pressure resistant container, and thereafter the pressure resistant container was held at 500° C., and the pressure resistant container was internally vacuumed for two days or more to dry the KF powder and the $WO_3$ powder.

Furthermore, 148 g of $B_2O_3$ powder was sealed in another pressure resistant container and thereafter the pressure resistant container was held at 380° C. and internally vacuumed for two days or more to dry the $B_2O_3$ powder.

Figure 9:
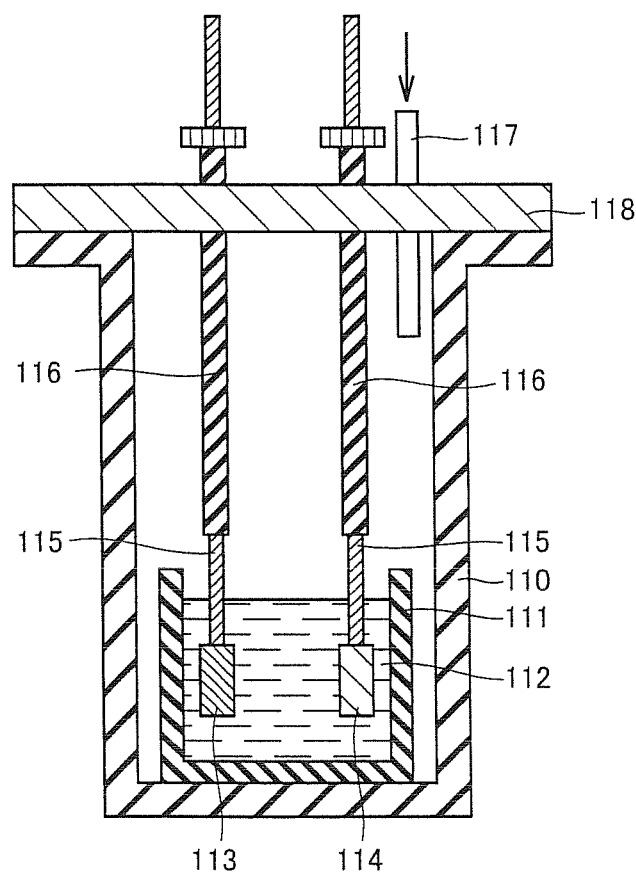
FIG. 9 schematically shows a configuration of equipment used in Examples 1-4.

Then the equipment shown in the schematic configuration in FIG. 9 was employed to prepare a molten salt bath from the dried KF powder, $B_2O_3$ powder and $WO_3$ powder.

More specifically, the dried KF powder, $B_2O_3$ powder and $WO_3$ powder were introduced into a crucible 111 formed of SiC and dried for two days or more at 500° C., and crucible 111 with the powders introduced therein was sealed in a vacuum proof vessel 110 of quartz.

Subsequently, vacuum proof vessel 110 had an upper opening closed with a lid 118 formed of SUS316L, and, in that condition, crucible 111 was held at 500° C., and vacuum proof vessel 110 was internally vacuumed for one day or more.

Subsequently, high purity argon gas was introduced into vacuum proof vessel 110 through a gas inlet 117 and crucible 111 was held at 850° C. to melt the above-mentioned powders to prepare a molten salt bath precursor 112.

Then, a rod electrode including tungsten plate 113 (surface: 20 $cm^2$) as a positive electrode and a rod electrode including nickel plate 114 (surface: 20 $cm^2$) as a negative electrode were inserted through an opening provided through lid 118, and tungsten plate 113 and nickel plate 114 were immersed into molten salt bath precursor 112 in crucible 111.

Herein, the rod electrodes had tungsten plate 113 and nickel plate 114 with a lead 115 connected thereto, and lead 115 internal to vacuum proof vessel 110 was implemented as tungsten wire and lead 115 external to vacuum proof vessel 110 was implemented as copper wire. Furthermore, lead 115 had at least a portion covered with a covering material 116 formed of alumina.

Furthermore, when the rod electrodes were inserted, high purity argon gas was introduced into vacuum proof vessel 110 through gas inlet 117 to prevent atmospheric air from entering vacuum proof vessel 110.

Furthermore, tungsten plate 113 and nickel plate 114 had their respective, entire surface areas immersed in molten salt bath precursor 112, as shown in FIG. 9, in order to prevent impurity from being introduced into molten salt bath precursor 112 as tungsten plate 113 and nickel plate 114 were oxidized.

Then, molten salt bath precursor 112 was electrolyzed to deposit an impurity on nickel plate 114 and thus remove the impurity from molten salt bath precursor 112 to prepare a molten salt bath.

Subsequently, nickel plate 114 with the impurity deposited thereon was replaced with a 40-μm-thick copper foil, and thereafter a current having a current density of 3 $A/dm^2$ was passed for 17 minutes between tungsten plate 113 and the copper foil to perform constant current electrolysis of the molten salt bath and thus deposit tungsten on the opposite surfaces of the copper foil to form a 5-μm-thick tungsten layer. Then the copper foil with the tungsten layer was ejected from the equipment shown in FIG. 9 and the tungsten layer's surface was cleaned with ion exchanged water to remove the molten salt bath on the tungsten layer, and thereafter it was cleaned with acid to remove oxide film on a surface of the tungsten layer to produce a heat sink of Example 1.

The heat sink of Example 1 was measured for a coefficient of linear expansion (ppm/° C.) in the horizontal direction. The result is shown in Table 1. Note that the coefficient of linear expansion (ppm/° C.) was measured with a thermomechanical analyzer (TMA) for a range in temperature from room temperature to 150° C., and the obtained values were averaged.

<Production of Heat Sink of Example 2>

A heat sink of Example 2 was produced in a manner similar to Example 1 except that between a 20-μm-thick copper foil and the equipment's tungsten plate 113 shown in FIG. 9 a current having a current density of 3 $A/dm^2$ was passed for 136 minutes to perform constant-current electrolysis of a molten salt bath to deposit tungsten on the opposite surfaces of the copper foil to form a 40-μm-thick tungsten layer.

As well as the heat sink of Example 1, the heat sink of Example 2 was also measured for a coefficient of linear expansion (ppm/° C.) in the horizontal direction. The result is shown in Table 1.

<Production of Heat Sink of Example 3>

A heat sink of Example 3 was produced in a manner similar to Example 1 except that 10-μm-thick copper foil was used. As well as the heat sink of Example 1, the heat sink of Example 3 was also measured for a coefficient of linear expansion (ppm/° C.) in the horizontal direction. The result is shown in Table 1.

<Production of Heat Sink of Example 4>

Initially, except that between a 100-μm-thick copper foil and the equipment's tungsten plate 113 shown in FIG. 9 a current having a current density of 3 $A/dm^2$ was passed for 340 minutes to perform constant-current electrolysis of a molten salt bath, a manner similar to that in Example 1 was used to deposit tungsten on the opposite surfaces of the copper foil to form a 100-nm-thick tungsten layer.

Then the copper foil with the tungsten layer was ejected from the equipment shown in FIG. 9 and the tungsten layer's surface was cleaned with ion exchanged water to remove the molten salt bath on the tungsten layer, and thereafter it was cleaned with acid to remove oxide film on a surface of the tungsten layer.

After the oxide film was removed, the tungsten layer's surface was immersed in an alkaline degreasing liquid (Ace Clean A-220 produced by Okuno Chemical Industries Co., Ltd.) at 50° C. for 20 minutes and thus cleaned.

Subsequently, the cleaned tungsten layer was immersed in an alkaline aqueous solution as a positive electrode and electrolysis (alkaline positive electrode electrolysis) was performed to remove oxide film from a surface of the tungsten layer.

Subsequently, a single cobalt plate and the copper foil having undergone the alkaline positive electrode electrolysis were immersed in a cobalt plating solution of an aqueous solution of cobalt sulfate as a positive electrode and a negative electrode, respectively, opposite to each other. Herein, the cobalt plating solution was an aqueous solution of cobalt sulfate having 200 g of cobalt sulfate and 100 g of sulfuric acid dissolved in water per one liter of the cobalt plating solution.

The cobalt plating solution was held at 80° C., and, in that condition, a current having a current density 15 A/dm$^2$ was passed for 3 minutes between the positive electrode and the negative electrode.

Under this condition the cobalt plating solution was electrolyzed to deposit cobalt on each surface of the tungsten layer of the copper foil or the negative electrode to form a 0.5-μm-thick cobalt layer on each surface of the tungsten layer on the opposite surfaces of the copper foil.

Then, the copper foil with the cobalt layer was ejected from the cobalt plating solution, and ion exchanged water was used to wash away the cobalt plating solution on the tungsten layer and thereafter, the intermediate product was cleaned with acid to remove oxide film formed on a surface of the tungsten layer.

Subsequently, a counter electrode in the form of a single sheet of phosphorus-containing copper and the copper foil with the cobalt layer were immersed opposite to each other in a copper sulfate plating solution (Levco EX produced by C. Uyemura & CO., LTD.) in a Pyrex® beaker.

The copper sulfate plating solution was held at 30° C., and, in that condition, a current was passed for 1470 minutes between the positive electrode or the counter electrode and the negative electrode or the copper foil with the cobalt layer such that a current of 20 mA (milliamperes) was passed per 1 cm$^2$ of the surfaces of the electrodes (current density: 20 mA/cm$^2$).

Under this condition the copper sulfate plating solution was electrolyzed to deposit copper on each surface of the cobalt layer on the opposite surfaces of the copper foil, or the negative electrode, to form a 49-μm-thick copper layer.

After the copper foil was provided with the copper layer, the copper layer's surface was cleaned with ion exchanged water to remove the copper sulfate plating solution on the copper layer, and thereafter the intermediate product was cleaned with acid to remove oxide film on a surface of the copper layer to produce the heat sink of Example 4.

As well as the heat sink of Example 1, the heat sink of Example 4 was also measured for a coefficient of linear expansion (ppm/° C.) in the horizontal direction. The result is shown in Table 1.

TABLE 1

|  |  |  | Example 1 | Example 2 | Example 3 | Example 4 |
|---|---|---|---|---|---|---|
| Conditions for Production |  | Thickness of Copper Foil (μm) | 40 | 20 | 10 | 100 |
|  | Tungsten Layer | Thickness (μm) | 5 | 40 | 5 | 100 |
|  |  | Duration of Electrolysis (min.) | 17 | 136 | 17 | 340 |
|  | Cobalt Layer | Thickness (μm) | 0 | 0 | 0 | 0.5 |
|  |  | Duration of Electrolysis (min.) | 0 | 0 | 0 | 3 |
|  | Copper Layer | Thickness (μm) | 0 | 0 | 0 | 49 |
|  |  | Duration of Electrolysis (min.) | 0 | 0 | 0 | 1470 |
| Product |  | Total Thickness (μm) | 50 | 100 | 20 | 399 |
|  |  | W/(Cu + W) | 0.2 | 0.8 | 0.5 | 0.501 |
| Physical Property |  | Coefficient of Linear Expansion in Horizontal Direction (ppm/° C.) | 13 | 5.4 | 7.7 | 7.8 |

It has been confirmed that Examples 1-4 each have provided a heat sink that can be produced with as small a total thickness as 100 μm or smaller and can also be produced efficiently through electroplating using a plating solution.

Furthermore, as shown in Table 1, Examples 1-4 each provide a heat sink such that the ratio of the tungsten layers' total thickness to the sum of the copper layers' total thickness (including the copper foil's thickness) and the tungsten layers' total thickness is not less than 0.2 and not more than 0.8, and it has been confirmed that they are excellent heat sinks which neither provide excessively large linear expansion nor excessively small thermal conductivity.

<Production of Heat Sink of Example 5>

Initially, potassium fluoride (KF) powder, boron oxide (B$_2$O$_3$) powder, and tungsten oxide (WO$_3$) powder were mixed together at a molar ratio of 67:26:7 to prepare a mixture thereof which was in turn introduced into a crucible formed of SiC (produced by AS ONE Corporation).

Herein, potassium fluoride (KF) powder, boron oxide (B$_2$O$_3$) powder, and tungsten oxide (WO$_3$) powder were each weighed within a glove box of Ar (argon) atmosphere and introduced into a crucible formed of SiC and provided in the same glove box.

Subsequently, the crucible formed of SiC with the mixture therein was heated with a heating mantle at 850° C. to melt the mixture to prepare a molten salt bath.

Subsequently, in the glove box, a tungsten plate serving as a counter electrode (a positive electrode) and together therewith a 40-nm-thick copper foil (a negative electrode) were immersed in the molten salt bath, opposite to each other.

Herein, the positive electrode and the negative electrode each had nickel wire welded thereto to allow a current to be supplied from the nickel wire to between the positive electrode and the negative electrode.

Then, the molten salt bath was held at 850° C., and, in that condition, while the positive electrode and the negative electrode were swung, a current was passed for 150 minutes between the positive electrode and the negative electrode such that a current of 30 mA (milliamperes) was passed per 1 cm$^2$ of the surface of the positive electrode (current density: 30 mA/cm$^2$).

Under this condition, the molten salt bath was electrolyzed to deposit tungsten on a surface of the negative electrode, or the copper foil, to form a tungsten layer formed of tungsten deposit and having a thickness of 30 μm.

Then, outside the glove box, the copper foil with the tungsten layer was ejected from the molten salt bath and the tungsten layer's surface was cleaned with ion exchanged water to remove the molten salt bath on the tungsten layer, and thereafter it was cleaned with acid to remove oxide film on a surface of the tungsten layer. The heat sink of Example 5 was thus produced.

It has been confirmed that Example 5 has provided a heat sink that can be produced with as small a total thickness as 100 μm and can also be produced efficiently through molten salt bath plating.

Furthermore, Example 5 provides a heat sink such that the ratio of the tungsten layers' total thickness to the sum of the copper layers' total thickness (including the copper foil's thickness) and the tungsten layers' total thickness is 0.6, which falls within a range of not less than 0.2 and not more than 0.8, and it has been confirmed that it is an excellent heat sink which neither provides excessively large linear expansion nor excessively small thermal conductivity.

<Production of LED Devices of Examples 1-5>

Five wafers each having a sapphire substrate having one surface with an LED structure formed thereon were then produced.

Herein, the five wafers were produced as follows: Initially, a sapphire substrate having a circular surface having a diameter of 100 mm, and having a thickness of 100 μm was prepared and on a surface thereof, an n type GaN layer, then an undoped InGaN active layer, and then a p type GaN layer were grown epitaxially by MOCVD.

Subsequently, the n type GaN layer, the undoped InGaN active layer, and the p type GaN layer were partially photo-etched away to expose a portion of a surface of the n type GaN layer.

Then, lift off was performed to provide an n electrode on the n type GaN layer, a semi-transparent electrode on the p type GaN layer, and a p electrode on the semi-transparent electrode to produce the above-mentioned wafers.

The heat sinks of Examples 1-5 produced as above were joined to the wafers, respectively, on a surface opposite to that having the LED structure, or a back surface, with eutectic solder, and a round rotary blade was used to divide the wafers into LED devices of a size having a square surface of 10 mm×10 mm to obtain LED devices for Examples 1-5.

<Evaluation of LED Devices of Examples 1-5>

An LED device of a comparative example was produced as described above, except that a copper plate and a tungsten plate were pressure-welded and thus joined together to form a metal laminated structure of copper (20 μm)/tungsten (60 μm)/copper (20 μm) and having a total thickness of 1 mm to serve as a heat sink, and this heat sink and an LED structure were joined together using the above eutectic solder to provide the LED device.

The emission characteristics of the LED devices of Examples 1-5 are compared with that of the LED device of the comparative example and it has been found that the former was equivalent to the latter.

However, the LED devices of Examples 1-5 each had a heat sink having a thickness of 100 μm or less, whereas that of the comparative example had a heat sink having a thickness of 1 mm, and when the former is compared with the latter, the former can have a heat sink formed at a smaller cost for its materials and furthermore, facilitate cutting the wafer with the round rotary cutter and thus allows better workability.

It should be understood that the embodiments and examples disclosed herein are illustrative and non-restrictive in any respect. The scope of the present invention is defined by the terms of the claims, rather than the description above, and is intended to include any modifications within the scope and meaning equivalent to the terms of the claims.

Industrial Applicability

The present metal laminated structure and the present method for producing a metal laminated structure are applicable for example to a heat sink of a semiconductor device.

Reference Signs List

1: first metal layer; 2: second metal layer; 3: third metal layer; 4: fourth metal layer; 5: fifth metal layer; 6: counter electrode; 7: container; 8: molten salt; 9: electroplating solution 10: LED structure; 11: p-type semiconductor layer; 12: active layer; 13: n-type semiconductor layer; 14: semiconductor substrate; 15: p electrode; 16: n electrode; 17: semi-transparent electrode; 31a: first roll; 31b: second roll; 41: joining layer; 100, 200: metal laminated structure; 110: vacuum proof vessel; 111: crucible; 112: molten salt bath precursor; 113: tungsten plate; 114: nickel plate; 115: lead; 116: covering material; 117: gas inlet; 118: lid.

The invention claimed is:

1. A method for producing a metal laminated structure, comprising the steps of:
    disposing a first metal layer on one surface of a second metal layer by plating;
    disposing a third metal layer on the other surface of said second metal layer by plating;
    disposing a fourth metal layer containing copper on a side of said first metal layer opposite to that side of said first metal layer provided with said second metal layer by electroplating a copper sulfate solution; and
    disposing a fifth metal layer containing copper on a side of said third metal layer opposite to that side of said third metal layer provided with said second metal layer by electroplating a copper sulfate solution,
    wherein said plating is molten salt bath plating,
    wherein the metal laminated structure comprises said first metal layer, said second metal layer and said third metal layer,
    said first metal layer being disposed on one surface of said second metal layer,
    said third metal layer being disposed on the other surface of said second metal layer,
    said first metal layer including tungsten,
    said second metal layer including copper,
    said third metal layer including tungsten,
    wherein the metal laminated structure has a total thickness of not less than 20 μm and not more than 100 μm.

2. The method for producing the metal laminated structure according to claim 1, wherein:
    a ratio of a sum in thickness of said first metal layer and said third metal layer to a sum in thickness of said first metal layer, said second metal layer and said third metal layer is not less than 0.2 and not more than 0.8.

3. The method for producing the metal laminated structure according to claim 1, wherein:
    a ratio of a sum in thickness of said first metal layer and said third metal layer to a sum in thickness of said first metal layer, said second metal layer, said third metal layer, said fourth metal layer and said fifth metal layer is not less than 0.2 and not more than 0.8.

4. The method for producing the metal laminated structure according to claim 1, wherein:
   the method further comprises the step of forming a cobalt containing layer at at least one of a position between said first metal layer and said fourth metal layer and a position between said third metal layer and said fifth metal layer.

5. The method for producing the metal laminated structure according to claim 4, wherein said cobalt containing layer has a thickness of not less than 0.05 μm and not more than 3 μm.

6. A method for producing a heat sink comprising the method for producing the metal laminated structure recited in claim 1.

7. The method for producing the metal laminated structure according to claim 1, further comprising the step of:
   forming a molten salt bath of a mixture containing potassium fluoride, boron oxide and tungsten oxide, and
   said molten salt bath plating is conducted using said molten salt bath.

* * * * *